United States Patent
Tanaka et al.

(10) Patent No.: US 6,567,972 B1
(45) Date of Patent: May 20, 2003

(54) METHOD AND APPARATUS FOR CORRECTING MASK PATTERN, MASK HAVING CORRECTED MASK PATTERN, AND STORAGE MEDIUM STORING PROGRAM FOR EXECUTING THE METHOD FOR CORRECTING MASK PATTERN

(75) Inventors: Satoshi Tanaka, Kawasaki (JP); Soichi Inoue, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 273 days.

(21) Appl. No.: 09/609,715

(22) Filed: Jun. 30, 2000

(30) Foreign Application Priority Data

Jun. 30, 1999 (JP) ............................................ 11-185856

(51) Int. Cl.[7] .............................................. G06F 17/50
(52) U.S. Cl. .......................................... 716/21; 716/19
(58) Field of Search ..................... 716/19–21; 382/144; 356/237.4, 237.5

(56) References Cited

U.S. PATENT DOCUMENTS

| | | | | |
|---|---|---|---|---|
| 5,502,001 A | * | 3/1996 | Okamoto | 219/121.69 |
| 5,546,225 A | * | 8/1996 | Shiraishi | 355/53 |
| 6,014,456 A | * | 1/2000 | Tsudaka | 382/144 |
| 6,316,163 B1 | * | 11/2001 | Magoshi et al. | 430/296 |

FOREIGN PATENT DOCUMENTS

JP  08-202020  8/1996

OTHER PUBLICATIONS

Stirniman, J.P. et al., "Fast Proximity Correction With Zone Sampling", SPIE vol. 2197, p. 294–301, (1994).
Inoue, S. et al., "Automatic Optical Proximity Correction With Optimization of Stepper Condition", SPIE vol. 2440, p. 240–251, (1995).

* cited by examiner

*Primary Examiner*—Vuthe Siek
*Assistant Examiner*—Paul Dinh
(74) *Attorney, Agent, or Firm*—Finnegan, Henderson, Farabow, Garrett & Dunner, L.L.P.

(57) ABSTRACT

A method for correcting a mask pattern comprising the steps of inputting a layout pattern, extracting mask patterns from this layout pattern in a range on which the optical proximity effects exert, classifying the patterns so extracted into to-be-corrected patterns subjected to a pattern correction together with an interest pattern edge correction and reference patterns whose edges are not moved, correcting only the to-be-corrected patterns collectively according to a set exposure condition so that dimensions of the transferred patterns are identical to those of the layout pattern, calculating the exposure dose at a focal position necessary for ensuring the depth of focus, and modifying a correction amount of each of the above-mentioned to-be-corrected patterns by comparing the exposure dose according to the set exposure dose condition and the exposure dose calculated by the calculation step.

20 Claims, 6 Drawing Sheets

METHOD AND APPARATUS FOR CORRECTING MASK PATTERN, MASK HAVING CORRECTED MASK PATTERN, AND STORAGE MEDIUM STORING PROGRAM FOR EXECUTING THE METHOD FOR CORRECTING MASK PATTERN

CROSS-REFERENCE TO RELATED APPLICATIONS

This application is based upon and claims the benefit of priority from the prior Japanese Patent Application No. 11-185856, filed Jun. 30, 1999, the entire contents of which are incorporated herein by reference.

BACKGROUND OF THE INVENTION

The present invention relates to a method for correcting a mask pattern deviated due to the optical proximity effects that arise when a pattern of an exposure mask is transferred onto a substrate, and particularly relates to a method for correcting a mask pattern in consideration of various deviations that are assumed in the optical lithography process (deviations in exposure dose, focusing, etc.).

Further, the present invention relates to an exposure mask formed by using the above-mentioned correction method, and also relates to a storage medium which stores a program for executing the above-mentioned correction method by a computer.

Recently, along with micronization of the LSI, there has been elicited the optical proximity effects (OPE; hereinafter referred to as "OPE") wherein CD (critical dimension) deviation and geometric deformation occur between a pattern of an exposure mask and a pattern obtained on a wafer. Therefore, in order to obtain a desired pattern on the wafer, an optical proximity correction (OPC) technique for correcting a mask pattern in consideration with the influence of the OPE becomes necessary.

The conventional OPC technique is such that the OPE under a certain exposure condition (the exposure dose, the focal position) is predicted experimentally or by calculation and a mask pattern is corrected based on the prediction. However, along with the micronization of LSI patterns, permissible CD deviation when forming a transferred pattern becomes much smaller. Consequently, an OPC technique considering various deviations that arise when transferring a mask pattern (i.e. deviations in the focal position, the exposure dose, etc.) is desired.

For the OPC technique that considers the above-mentioned deviations, a method considering mainly the deviation in the focusing has been disclosed, for example, as described in a paper by John P. Stirniman et. al, "Fast proximity correction with zone sampling," Proceeding of SPIE, Vol.2197, pp.294–300. However, an optimum corrected pattern is not necessarily obtained by this technique when assuming the deviation in the exposure dose.

Also, regarding a memory cell section, there has been disclosed a correction method for maximizing both exposure dose range (i.e. exposure dose latitude) and focal range (i.e. the depth of focus) which can form the pattern within a predetermined amount of deviation in sizes, in a document by the present inventors (S. Inoue et. al), "Automatic optical proximity correction with optimization of stepper condition", Proceeding of SPIE, Vol.2440, pp.240–251. However, this document treats only the correction in an extremely limited region, that is, within a single cell, and the correction calculation is performed using a kind of the random search method based on simulated annealing; therefore, when this method is applied to a random pattern, it takes too much time for the calculation and it is thought that the processing in a practical period of time is impossible.

As can be understood in the foregoing, when one wishes to correct the OPE on a mask pattern considering the margin of the exposure dose, a considerably increased time is conventionally required for the correction process, and hence high-speed processing is impossible, and that it is difficult to achieve correction accuracy sufficiently.

It is an object of the present invention to provide a method for correcting a mask pattern capable of performing high-precision correction in consideration of the margin of the exposure dose without greatly increasing the load of the OPC processing for a mask pattern.

Moreover, it is a further object of the present invention to provide an exposure mask that is formed using the above-mentioned correction method and capable of contributing the improvement of the accuracy of the pattern transferring.

Furthermore, it is another object of the present invention to provide a storage medium storing a program for making a computer execute the above-mentioned correction method.

BRIEF SUMMARY OF THE INVENTION

A first aspect of the present invention is a method for correcting a mask pattern where a design mask pattern is corrected considering the influence of the OPE that arises when the design mask pattern is transferred onto a substrate, and provides a method for correcting a mask pattern comprising the steps of: correcting the mask pattern so that the edges of a transferred pattern formed at a predetermined focal position with a previously-given exposure dose are located at the desired edge location of the pattern within an amount of the displacement from a desired edge location of the pattern that is determined to be smaller than a previously-set permissible displacement of the edge; and adding additional correction to the mask pattern in order to achieve a desired depth of focus at a boundary of the exposure dose latitude.

According to the first aspect of the invention, in the additional correction, if the exposure dose required for obtaining a position of the edge of a desired transferred pattern is changed by $\Delta E$ when the edges of an interest to-be-corrected pattern is moved a by $\Delta L$, the coefficient M, i.e., Exposure Dose MEF (Mask Enhanced Factor) is used, where it is determined by the following equation:

$$M = \Delta E / \Delta L.$$

A value obtained by dividing by the coefficient M a difference between an exposure dose for forming a desired edge displacement and the exposure dose latitude is added as a correction value to a pattern not satisfying a permissible edge position depending upon a boundary of the exposure dose latitude in a defocus position for obtaining a desired focal depth.

A second aspect of the present invention provides a method for correcting a mask pattern wherein a design mask pattern is corrected to suppress the influence of the OPE that arises when the design mask pattern is transferred onto a substrate, and specifically provides a method for correcting a mask pattern, the method comprising the steps of: extracting patterns in an OPE acting range; classifying the extracted patterns into to-be-corrected patterns whose edges are actually to be displaced and a reference pattern whose edges are not displaced in calculating the correction; and correcting the shape of the to-be-corrected patterns so that the to-be-corrected patterns all are transferred and finished onto a substrate with each edge being located within a permissible displacement of an edge.

The correction method according to the second aspect includes the step of adding an additional correction to the mask pattern to achieve a desired depth of focus with an exposure dose at a boundary of the exposure dose latitude.

According to the present invention, the edge position of a transferred pattern obtained at a predetermined focal position by a given exposure dose is corrected such that the edge position is within a displacement from a desired pattern edge position determined by a displacement amount $\Delta pos1$ smaller than a preset permissible edge displacement amount $\Delta pos$. Then, in order to consider the exposure dose, an additional correction is subjected to a mask pattern so that a desired focal depth is obtained at respective boundaries. As a result, a time required for a correction calculation is reduced in a large extent. A high precision correction can be performed without increasing the load for correction processing.

Further, the extracted patterns are classified into the to-be-corrected patterns and the reference patterns and only the to-be-corrected patterns are corrected, whereby interest pattern edges can be corrected in a high-accuracy manner while suppressing the load of the correction processing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereafter details of the present invention will be described referring to the embodiment shown in the drawings.

Figure 1:
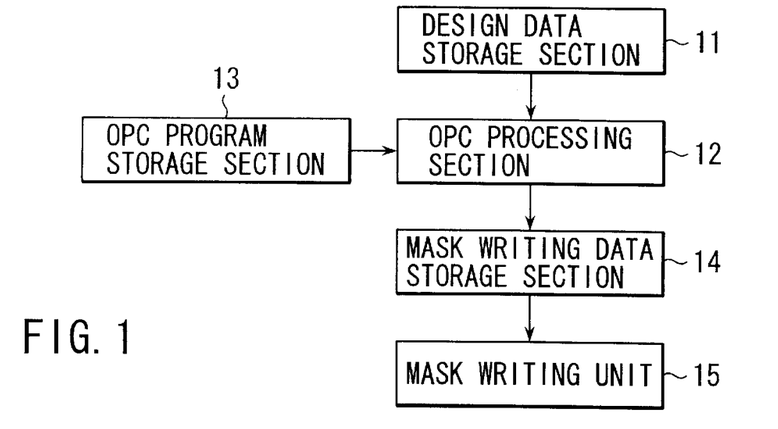
FIG. 1 is a block diagram of a mask manufacturing apparatus which adopts a method for correcting a mask pattern according to one embodiment of the present invention.

FIG. 1 shows the mask manufacturing apparatus which uses the method for correcting a mask pattern according to one embodiment of the present invention. The mask manufacturing apparatus comprises a design data storage section 11, an OPC processing section 12, a program storage section 13, a mask writing data storage section 14, and a mask pattern writing unit 15.

The design data storage section 11 stores the design data of a mask pattern. This design data storage section 11 is connected to the OPC processing section 12. This OPC processing section 12 operates in accordance with an OPC program stored in the OPC program storage section 13 and performs the OPC processing for correcting the CD deviation and the geometric deformation occurring between the pattern of an exposure mask and the pattern obtained on a substrate due to the OPE. That is, the mask pattern is corrected considering the deviations in the exposure dose and focusing so that a mask pattern written by the mask pattern writing unit 15 reflects the design data fairy accurately.

The mask writing data obtained by the OPC processing section 12 is stored in the mask writing data storage section 14. The mask writing unit 15 makes the exposure mask in accordance with the mask writing data through; the process of inputting the mask writing data read from the mask writing data storage section 14 into the mask writing unit 15.

Next, the processing of the mask manufacturing apparatus having the above configuration, especially the processing at the OPC processing section will be described referring to the flowchart of FIG. 2.

First of all, the method for calculating the correction amount for an interest edge of the pattern that was extracted from the mask pattern in a one-dimensional manner in consideration of the margin of lithography will be described.

Figure 2:
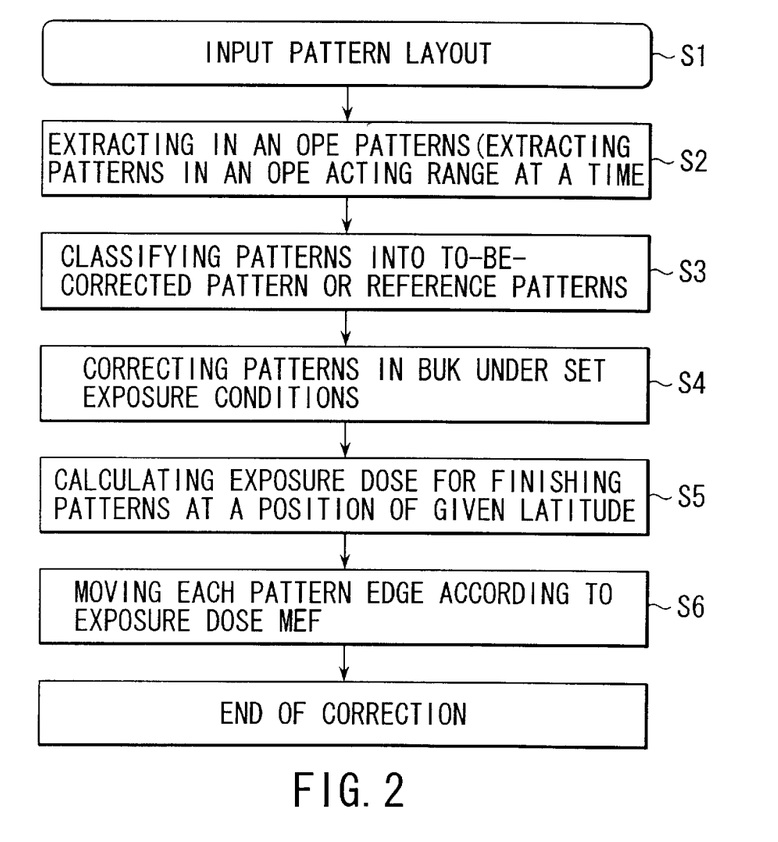
FIG. 2 is a view showing a correction algorithm of the method for correcting a mask pattern according to one embodiment of the present invention.

First, in the step S1 of FIG. 2, a layout pattern (an original mask pattern as specified by the design data) which contains edges of the to-be-corrected pattern is input. Individual patterns in a range on which the OPE exerts are extracted from the layout pattern, taking the center on an interest pattern edge (step S2). The OPE mentioned here indicates a phenomenon that the transferred edge location of the interest pattern is varied due to individual patterns of the layout pattern neighboring to the interest pattern and is not necessarily limited to one resulting from optical factors but may include phenomena resulting from development and etching processes.

Figure 6:
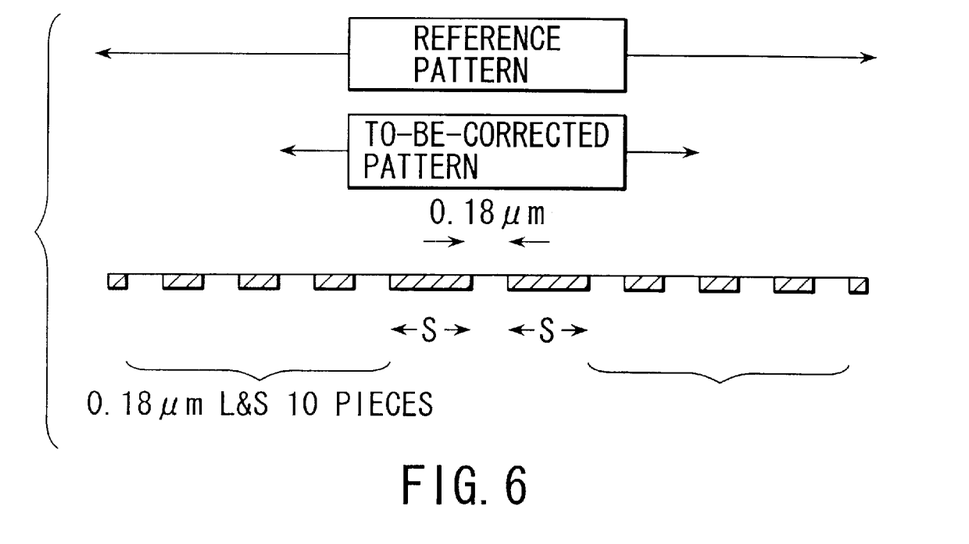
FIG. 6 is a view showing an example of a mask pattern used in the present embodiment.

Next, as shown in FIG. 6, the extracted patterns are classified into two kinds of the to-be-corrected patterns and the reference patterns (step S3). The to-be-corrected pattern indicates a pattern that is actually subjected to a pattern correction together with the edge correction of the interest pattern and whose edges are moved. In contrast to this, the reference pattern indicates a pattern that is considered as existing in the pattern correction but whose edges are not moved.

Next, only the to-be-corrected patterns are corrected collectively according to set exposure conditions so that dimensions of the transferred patterns are identical to those of the design data (step S4). The set exposure conditions mentioned here indicate exposure parameters, the type of a mask to be used (COG (chrome-on-glass) mask, half-tone phase-shifting mask, etc.), the exposure dose, and the condition of the focal position. The exposure parameters includes the exposure wavelength, the NA (numerical aperture) of a projection optical system of an exposure unit, the coherence factor σ, the light source shape, etc. Normally, the focal position is set to a just-focal position and the exposure dose is set so that a representative pattern is transferred as desired.

Figure 3:
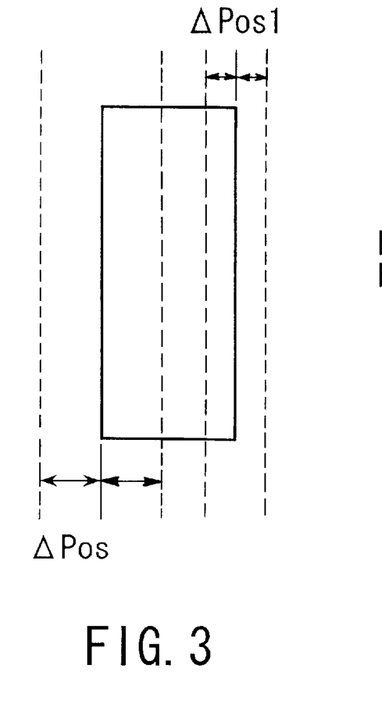
FIG. 3 is a view showing displacement of an edge.

The correction calculation is performed so that edge locations of the transferred patterns of the to-be-corrected patterns are all within a certain deviation simultaneously. That is, the mask pattern is corrected so that the edges of the transferred pattern at a just-focal position under the above-mentioned exposure conditions are formed at the desired edge locations of the pattern to a latitude specified by a displacement ΔPos1 that is determined to be smaller than a previously-set permissible displacement of the edge ΔPos as shown in FIG. 3 (in the embodiment, being ±10 percent).

Figure 4:
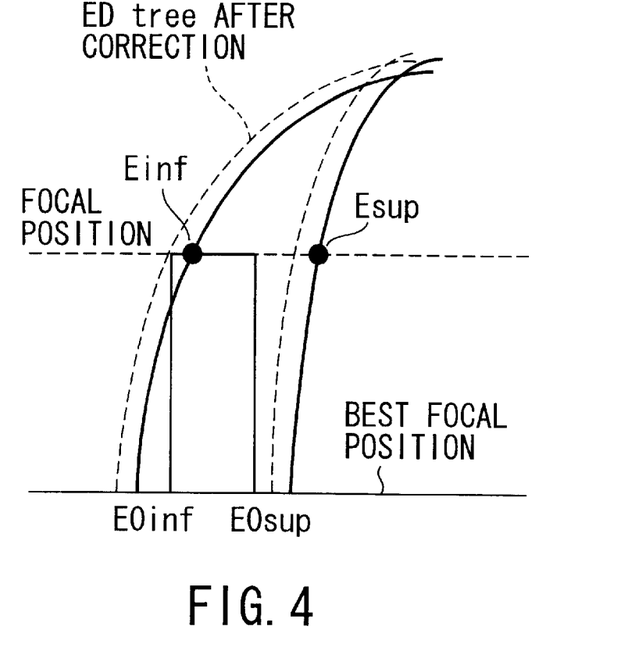
FIG. 4 is a schematic view showing a position for evaluation of the exposure dose on the ED diagram.

Next, in the step S5, obtained is the exposure doses ($E_{inf}$, $E_{sup}$) such that the edges of the transferred pattern are formed at the desired locations to a latitude of the permissible CD deviation at a focal position (DOF/2) that is necessary for ensuring the depth of focus (DOF). FIG. 4 shows the ED tree diagram (showing a relationship between a necessary exposure dose for obtaining a certain line width and the focal position). In this diagram, a horizontal axis represents the exposure dose and the vertical axis does the focal position, and solid lines indicate ED tree curves by the step S4 and broken lines do the ED tree curves after the correction by the step S6.

Based on this FIG. 4, exposure doses ($E_{0inf}$, $E_{0sup}$) obtained by calculating (the exposure dose $E_0$ used at the step S4) plus/minus (permissible CD deviation in the exposure dose) are compared with the above-mentioned exposure doses ($E_{inf}$, $E_{sup}$), and alteration of the correction amount is performed as follows (step S6):

i) when $E_{0inf} < E_{inf}$: the correction amount for the edge location of the mask pattern is altered by ($E_{inf} - E_{0inf}$)/M, ii) when $E_{sup} < E_{0sup}$: the correction amount for the edge location of the mask pattern is altered by ($E_{0sup} - E_{sup}$)/M, and iii) other cases: the correction amount is not altered.

Here, the coefficient M is a coefficient indicating how much the exposure dose necessary for obtaining a desired edge location changes when the edge location of the mask pattern is altered. In other words, if the exposure dose required for obtaining a position of the edge of a desired transferred pattern is changed by ΔE when the edges of an interest to-be-corrected pattern is moved by ΔL, the coefficient M, that is, Exposure Dose MEF (Mask Enhanced Factor) is determined by the following equation:

$$M = \Delta E / \Delta L.$$

A value obtained by dividing by the coefficient M a difference between an exposure dose for forming a desired edge displacement and the exposure dose latitude is added to a pattern not satisfying a permissible edge position depending upon a boundary of the exposure dose latitude in a defocus position for obtaining a desired focal depth.

Figure 5A:
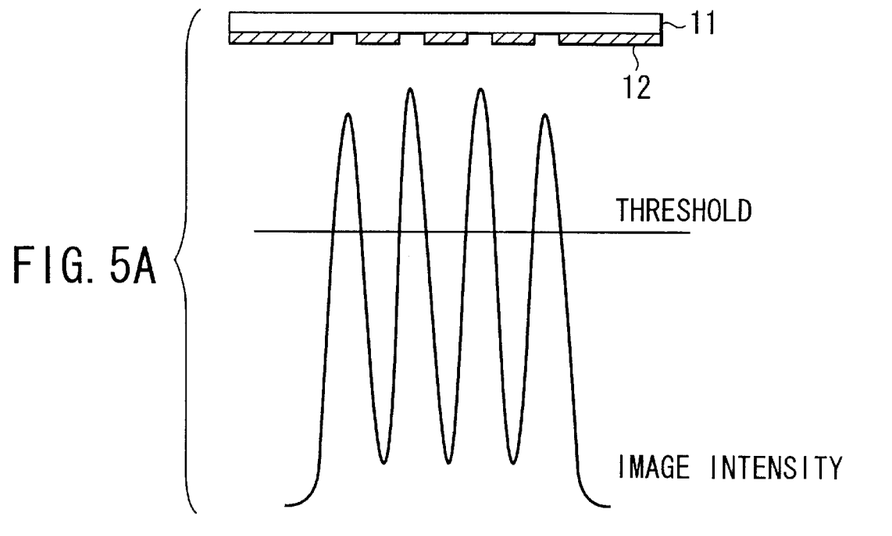
FIGS. 5A and 5B are views showing the relationship between the mask and the image intensity and a definition of a mask correction coefficient M.
Figure 5B:
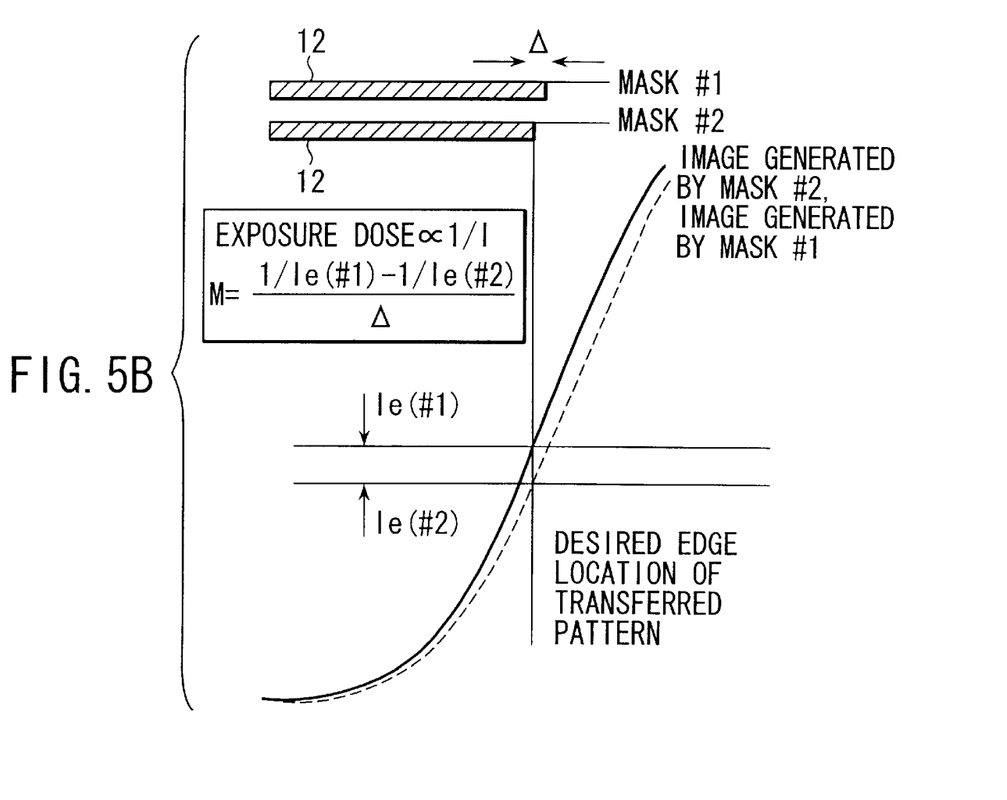

FIG. 5A shows the relationship between the exposure mask and the image intensity, and FIG. 5B shows the relationship between the deviation in the edge location of the mask pattern and finishing exposure dose. In this figure, shown are a transparent substrate 11 made of quartz etc. and an opaque film 12 made of Cr etc. When the deviation in the edge location is minute, the deviation in the edge location and the deviation in the exposure dose can be assumed to be in proportion to each other, as shown in FIG. 5B. Therefore, using the coefficient M, the ED tree can be shifted in a direction of the exposure dose while the shape of the ED tree is almost maintained in the ED diagram (a diagram of exposure dose versus defocus) by a desired amount of exposure dose through only one time of correction, as shown in FIG. 4.

By the way, in the FIG. 5B, the coefficient M is represented by the ratio of the difference of the exposure doses resulting from the deviation in the edge location to that deviation. However, it interferes nothing that the M is defined by the ration of the difference of the logarithm of the exposure doses corresponding to different edge locations to that deviation as in the following expression.

$$M' = (\log E - \log E_0)/\Delta = \{\log(E/E_0)\}/\Delta \qquad (1)$$

In line with an algorithm shown in FIG. 2, the result of correcting the mask pattern shown in FIG. 6 will be described. An interest edge of the to-be-corrected pattern shown in FIG. 6 is an edge of a space section in the middle of the pattern, and the evaluation was done using central line widths in the patterns having totally twelve kinds of S (the distance to the neighboring pattern) of 0.18 to 3 μm. The conditions used when correcting the pattern are shown below.

Exposure wavelength=248 nm, NA=0.6, central obscuration ratio=2/3,

COG (chrome-on-glass) mask,

The edge location of the pattern is determined by slicing an aerial image of the mask at a threshold level ($I_{th}$=0.292), and $I_{th}$ is equivalent to the exposure dose with which a line-and-space (L&S) pattern of a 0.18 μm width can be transferred and finished to the desired size under the just-focus condition.

In this calculation, the range on which the OPE exerts is not specified specially. Regarding the classification of the to-be-corrected patterns and the reference patterns, two neighboring patters and two neighboring-but-one patterns at the both sides of the interest pattern, totally five patterns, are specified as the to-be-corrected patterns, the rest patterns being specified as the to-be-referred patterns, and the calculation is performed. In this calculation, targeted exposure dose latitude and DOF are assumed to be 10 percent and 0.6 μm, respectively, for a permissible CD deviation of ±10 percent. That is, assuming that a permissible displacement of the edge $\Delta P_{os}$=9 nm, the calculation is carried out.

Figure 7:
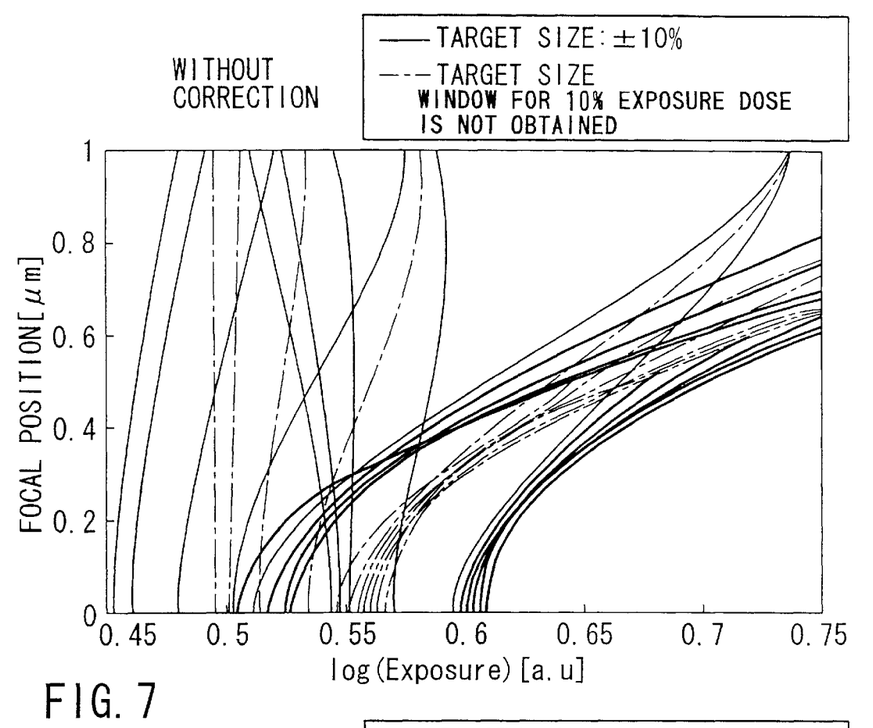
FIG. 7 is a view showing the evaluation without the correction by the ED diagram that is the correction results of the mask pattern.
Figure 8:
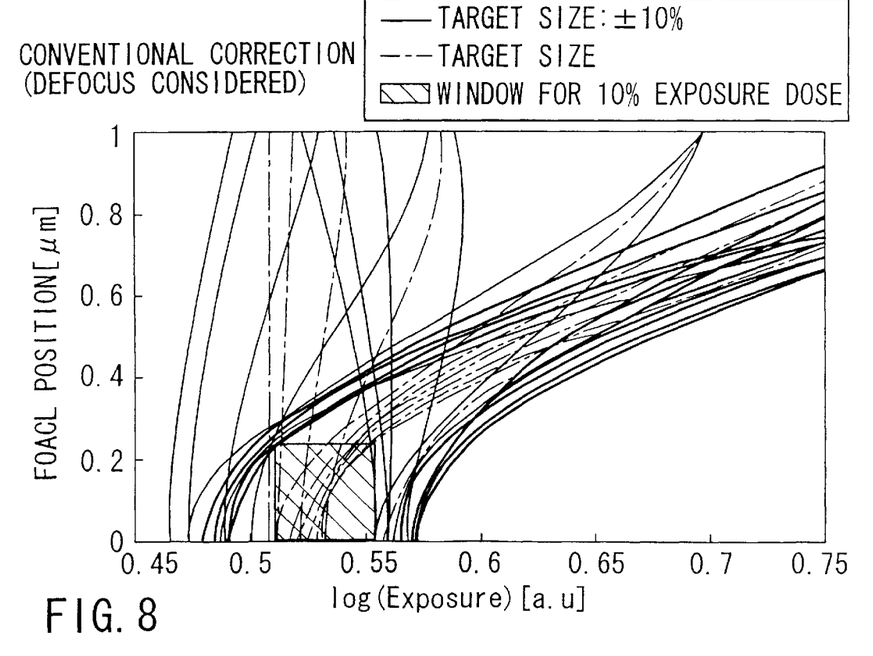
FIG. 8 is a view showing the evaluation by the ED diagram obtained through conventional correction.
Figure 9:
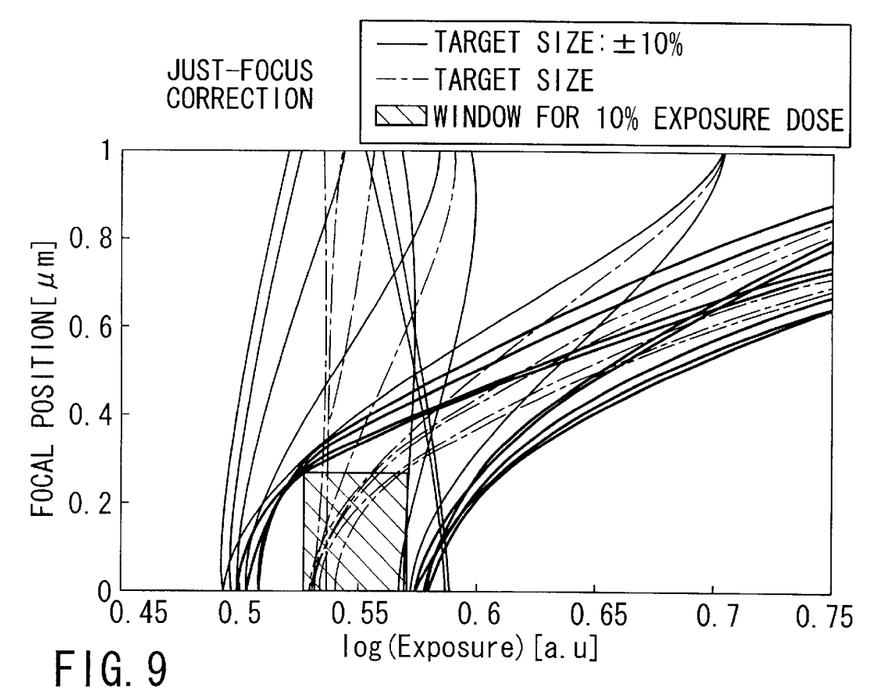
FIG. 9 is a view showing the evaluation of just focus correction by the ED diagram that is a correction result of the mask pattern.
Figure 10:
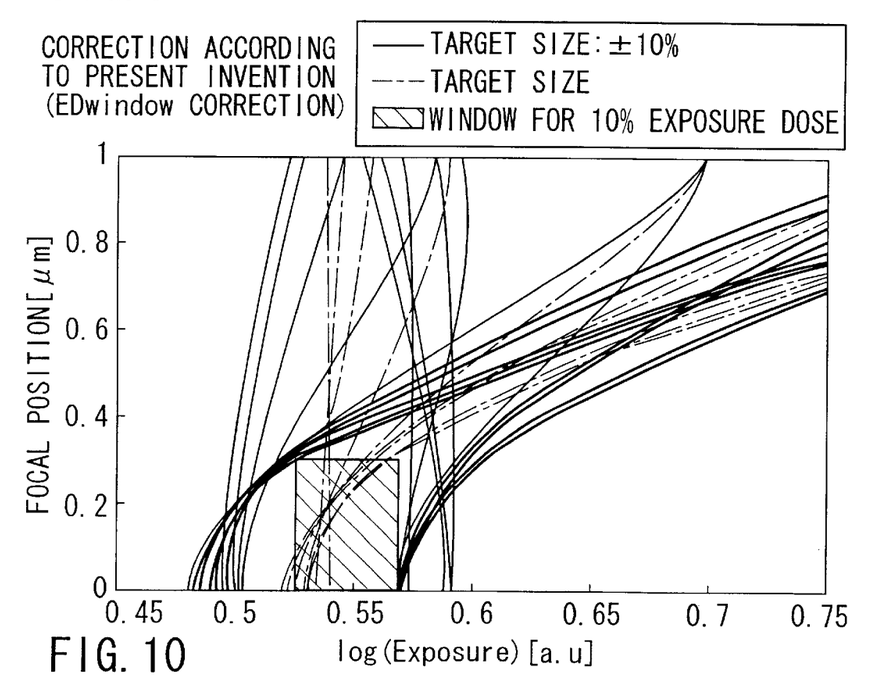
FIG. 10 is a view showing the evaluation of the correction of the present embodiment by the ED diagram of the correction result of a mask pattern.
Figure 11:
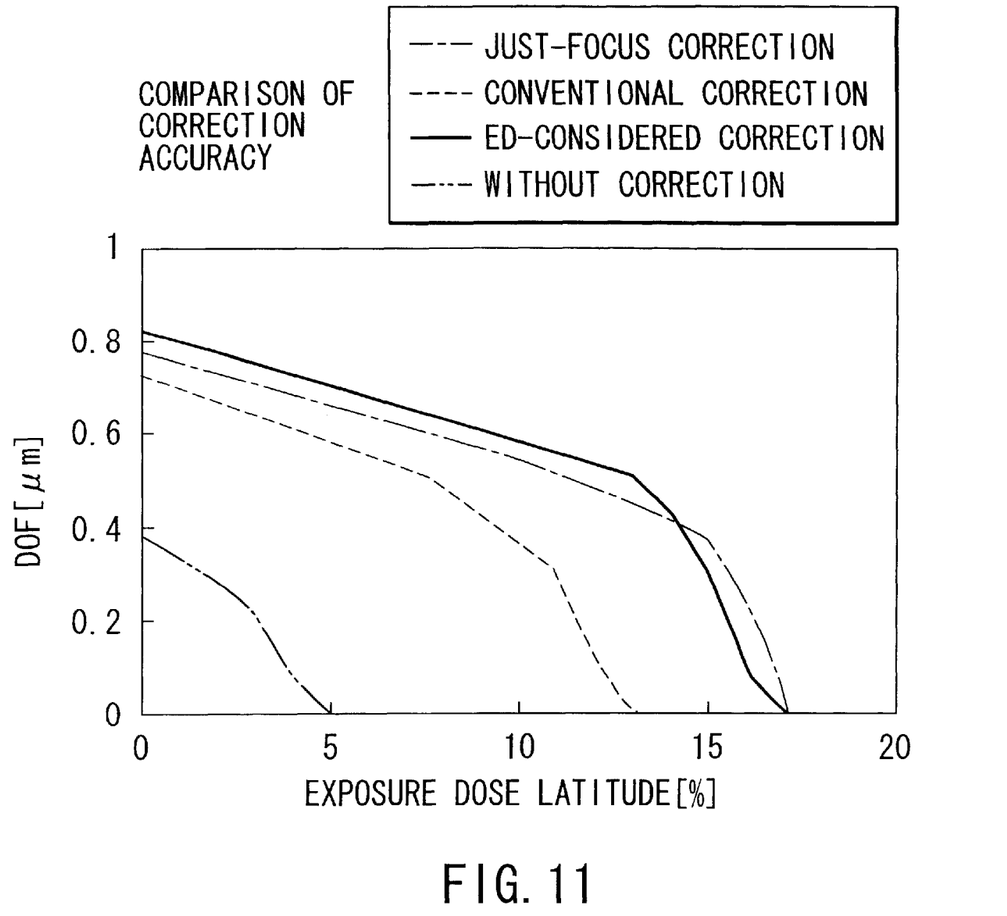
FIG. 11 is a view showing the exposure dose latitude versus the DOF created from the ED diagrams obtained from FIG. 9 and FIG. 10.

FIG. 7 to FIG. 10 show the relationship of the exposure dose and the focal position, that is, the evaluation result of the ED tree. FIG. 7 shows the evaluation results of the ED tree before the OPC is applied (i.e. without correction), FIG. 8 shows the evaluation results of the ED tree for a transferred pattern of a corrected pattern with the use of a conventional method, FIG. 9 shows the evaluation results of the ED tree obtained by just-focus correction, and FIG. 10 shows the evaluation results of the ED tree for a transferred pattern of a corrected pattern with the use of the present embodiment. Moreover, FIG. 11 shows a result of comparison between common latitudes for different corrections and no correction of the mask pattern. The conventional technique mentioned here indicates a technique where the mask pattern is corrected so that the DOF becomes 0.6 μm with a fixed exposure dose.

It is evident from FIG. 7 to FIG. 10 that in the conventional method where the exposure dose is fixed beforehand, the deviations in line width at a focal position and at a defocus position are intended to be suppressed to as small value as possible when the layout pattern is corrected so that the DOF becomes a desired value. Because of this restraint, this deviation in the line width cannot be set to a small amount and as a result the common latitude becomes smaller.

On the contrary, in the correction calculation of the present invention, the permissible CD deviation in the line width is set to ±14 nm. That is, a value of 7 nm is used for the displacement $\Delta P_{os1}$. If $\Delta P_{os1}$ is intended to be controlled below this value, convergence of the correction calculation deteriorates considerably. The just-focus correction in the figure stands for a method where the correction is added to the mask pattern by considering only the performance at the just-focal position. In this case, the deviation in the line width can be much suppressed than a conventional method. In performing this calculation, the permissible CD deviation in the line width can be set to ±2 nm. That is, a value of 1 nm is used as the displacement $\Delta_{os1}$. However, no consideration is given to the DOF, and hence it is probable that a necessary margin cannot be retained for a certain pattern configuration.

On the other hand, in the present embodiment, further correction is added after the just-focus correction so that the specified exposure dose and the DOF are ensured. In the present embodiment, the coefficient M is obtained for each pattern at a defocus position (+0.3 $\mu$m) that defines the DOF, and the correction amount of the interest pattern is further modified using these results. As described above, in the present embodiment, when the correction is modified in order to ensure the margin of the exposure dose, the modification of the correction is not performed at all of the boundaries of the ED tree but is performed only by adding amounts of offset which can be obtained using the coefficient that indicates a measure for how much the deviation in the exposure dose will change the finished size of the to-be-corrected pattern, hence enabling high-speed processing.

Further, regarding the accuracy of the correction, since the exposure dose latitude at a desired depth of focus (DOF)=0.6 $\mu$m is increased, as shown in FIG. 11, compared to the conventional correction technique and the just-focus correction technique, it is obvious that the accuracy obtainable with the present technique is improved compared to those of other techniques.

In addition, there is a further merit. That is, in the conventional method, after a pattern is extracted, the transferring of the pattern is checked under an exposure condition 1 (a just-focus condition), and if the result indicates NG, the correction is performed under the exposure condition 1. After the correction is performed so that a satisfactory result is obtained under the exposure condition 1, a check is performed under an exposure condition 2 (a defocus condition). If the result is NG, the correction is performed under the exposure condition 2. After the correction is performed so that a satisfactory result is obtained under the exposure condition 2, the flow of the correction goes back to the check and correction under the exposure condition 1 again. A set of the check and the correction at each exposure condition corresponds to a collective correction at the step S4 in the present embodiment. So this conventional technique requires two times of the collective correction. Further, after the correction is performed under the exposure condition 2, the check and correction under the exposure condition 1 becomes necessary, and therefore will be performed again.

On the contrary, in the present embodiment, collective correction at the step S4 is required only one time and is not required to be repeated, so that a time required for the correction processing can be greatly shortened compared to the conventional method. Moreover, in the present embodiment, the extracted patterns are classified to the to-be-corrected patterns and the reference patterns, narrowing down the number of the to-be-corrected patterns. In this respect, a time required for the correction processing can also be shortened.

By the way, it should be understood that the present invention is not limited to the embodiment described above. While the processing presented in the embodiment is for a one-dimensional pattern, it is obvious that an embodiment is not limited to one-dimensional patterns and the embodiment described above is not intended to impose any limitation on expansion to two-dimensional patterns. Moreover, the processing at the step S3 and the subsequent steps S4 to S6 in FIG. 2 contribute to the shortening of the processing time, so it is preferable that both of these steps are performed. However, either of these steps may be used to effect the shortening of the processing time.

Furthermore, the technique disclosed in the brief description of the preferred embodiment can be applied to various devices by writing it in a storage medium, for example, magnetic disks (floppy disk, hard disk, etc.), optical disks (CD-ROM, DVD, etc.), semiconductor memories, and the like as a program executable by a computer, and also to various devices by transmitting it via a transmission medium.

By the way, for a computer executing the present invention, any computer will do so long as it can read the program stored in a storage medium and perform the processing described above through the controlled operation thereof by this program.

As described in detail in the foregoing, according to the present invention, in the optical proximity correction of a mask pattern to be formed on an exposure mask, high-accuracy correction can be performed considering the margin of the exposure dose without considerably increasing the processing load of the optical proximity correction for a given mask pattern.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for correcting a mask pattern wherein a design mask pattern is corrected considering an influence of optical proximity effects beforehand that arise when the design mask pattern is transferred onto a substrate, comprising:

correcting the mask pattern so that at least one edge of a transferred pattern formed at a predetermined focal position with a previously-given exposure dose is located within a displacement from a desired pattern edge location, the displacement being determined to be smaller than a previously-set permissible edge displacement; and adding additional correction on the mask pattern in order to achieve a desired depth of focus with an exposure dose at a boundary of an exposure dose latitude.

2. A method for correcting a mask pattern according to claim 1, wherein said additional correction adds, as a correction value, a value obtained by dividing by a coefficient M a difference between an exposure dose for forming a desired edge displacement and the exposure dose latitude to a pattern not satisfying the permissible edge displacement depending upon a boundary of the exposure dose latitude in a defocus position for obtaining a desired focal depth, where if the exposure dose required for obtaining a desired position of the edge of the transferred pattern is changed by $\Delta E$ when the edge of an interest to-be-corrected pattern is moved by ΔL, the coefficient M is determined by the following equation:

$$M = \Delta E / \Delta L.$$

3. A method for correcting a mask pattern wherein a design mask pattern is corrected in order to suppress an influence of optical proximity effects that arise when the design mask pattern is transferred onto a substrate, comprising:

extracting patterns in a range on which the optical proximity effects exert;

classifying said patterns so extracted into to-be-corrected patterns whose edges are actually moved and reference patterns whose edges are not moved in a correction computation; and correcting shapes of said to-be-corrected patterns so that said to-be-corrected patterns are all transferred and finished onto a substrate with each edge being located within a permissible edge displacement.

4. A method according to claim 3, further comprising adding additional correction to the mask pattern in order to obtain a desired depth of focus with an exposure dose at a boundary of an exposure dose latitude.

5. A method for correcting a mask pattern, comprising:

inputting a layout pattern;

extracting patterns from said layout pattern in a range on which optical proximity effects exert;

classifying said patterns so extracted into to-be-corrected patterns subjected to a pattern correction together with an interest pattern edge correction and reference patterns whose edges are not moved;

correcting said to-be-corrected patterns collectively according to a set exposure condition so that dimensions of transferred patterns are identical to those of the layout pattern;

calculating an exposure dose at a focal position necessary for ensuring the depth of focus; and modifying a correction amount of each of said to-be-corrected patterns by comparing an exposure dose based on said set exposure condition and the exposure dose calculated by the calculating.

6. A method according to claim 5, wherein said set exposure condition includes exposure parameters, a numerical aperture of a projection optical system of an exposure unit, a light source size, a light source shape, a type of a mask to be used, an exposure dose, and a focal position.

7. A mask pattern correction apparatus which corrects a design mask pattern considering an influence of optical proximity effects beforehand that arise when a design mask pattern is transferred onto a substrate, comprising:

a correction section configured to correct a mask pattern so that at least one edge of a transferred pattern formed at a predetermined focal position with a previously-given exposure dose is located within a displacement from a desired pattern edge location, the displacement being determined to be smaller than a previously-set permissible edge displacement; and an additional correction section configured to add an additional correction on the mask pattern in order to achieve a desired depth of focus with an exposure dose at a boundary of an exposure dose latitude.

8. A mask pattern correction apparatus according to claim 7, wherein said additional correction adds, as a correction value, a value obtained by dividing by a coefficient M a difference between an exposure dose for forming a desired edge displacement and the exposure dose latitude to a pattern not satisfying the permissible edge displacement depending upon a boundary of the exposure dose latitude in a defocus position for obtaining a desired focal depth, where if the exposure dose required for obtaining a desired position of the edge of the transferred pattern is changed by ΔE when the edge of an interest to-be-corrected pattern is moved by ΔL, the coefficient M is determined by the following equation:

$$M = \Delta E / \Delta L.$$

9. A mask pattern correction apparatus for correcting a design mask pattern in order to suppress an influence of optical proximity effects that arise when the design mask pattern is transferred onto a substrate, comprising:

a storage section configured to store a layout pattern;

a pattern extraction section configured to extract patterns from the layout pattern in said storage section in a range on which the optical proximity effects exert;

a classification section configured to classify said patterns so extracted into to-be-corrected patterns whose edges are actually moved and reference patterns whose edges are not moved in a correction calculation; and a correction section configured to correct shapes of said to-be-corrected patterns so that said to-be-corrected patterns are all transferred and finished onto the substrate with each edge being located within a permissible edge displacement.

10. A mask pattern correction apparatus according to claim 9, further comprising an additional correction section configured to add additional correction to the mask pattern in order to achieve a desired depth of focus with an exposure dose at a boundary of an exposure dose latitude.

11. A mask pattern correction apparatus comprising:

a storage section configured to store a layout pattern;

an extraction section configured to extract mask patterns from said layout pattern in said storage section in a range on which optical proximity effects exert;

a classification section configured to classify said mask patterns so extracted into to-be-corrected patterns subjected to a pattern correction together with an interest pattern edge correction and reference patterns whose edges are not moved;

a correction section configured to correct collectively only said to-be-corrected patterns according to a set exposure condition so that dimensions of the transferred patterns are identical to those of the layout pattern;

a calculation section configured to calculate an exposure dose at a focal position necessary for ensuring the depth of focus; and a modification section configured to modify a correction amount of each of said to-be-corrected patterns by comparing the exposure dose according to said set exposure dose condition and the exposure dose calculated by said calculation section.

12. A mask pattern correction apparatus according to claim 11, wherein said set exposure condition includes exposure parameters, a numerical aperture of a projection optical system of an exposure unit, a light source size, a light source shape, a type of a mask to be used, an exposure dose, and a focal position.

13. An exposure mask manufacturing apparatus comprising:

a design data storage section configured to store design data of mask patterns;

an OPC processing section connected to said design data storage section and configured to perform an OPC processing for correcting a size deviation and a geometric deformation occurring between a pattern of an exposure mask and a pattern on a substrate due to optical proximity effects; and a mask writing unit configured to form an exposure mask according to mask writing data obtained by said OPC processing section;

wherein said OPC processing section comprises:

an extraction section configured to extract patterns in a range on which the optical proximity effects exert, from said storage section;

a classification section configured to classify said patterns so extracted into to-be-corrected patterns subjected to a pattern correction together with an interest pattern edge correction and reference patterns whose edges are not moved;

a correction section configured to correct collectively only said to-be-corrected patterns according to a set exposure condition so that dimensions of the transferred patterns are identical to those of the layout pattern;

a calculation section configured to calculate an exposure dose at a focal position necessary for ensuring a depth of focus; and a modification section configured to modify a correction amount of each of said to-be-corrected patterns by comparing the exposure dose according to said set exposure dose condition and the exposure dose calculated by said calculation section.

14. An exposure mask manufacturing apparatus comprising:

a design data storage section configured to store design data of mask patterns;

an OPC processing section connected to said design data storage section and configured to perform an OPC processing for compensating a critical dimension deviation and a shape deformation occurring between a pattern of an exposure mask and a pattern on a substrate due to optical proximity effects; and a mask writing unit configured to form an exposure mask according to mask writing data obtained by said OPC processing section;

wherein said OPC processing section comprises a mask pattern correction unit including:

a correction section configured to correct a mask pattern so that at least one edge of a transferred pattern formed at a predetermined focal position with a previously-given exposure dose is located within a displacement from a desired pattern edge location, the displacement being determined to be smaller than a previously-set permissible edge displacement; and an additional correction section configured to add additional correction to the mask pattern in order to achieve a desired depth of focus with an exposure dose at a boundary of an exposure dose latitude.

15. An exposure mask manufacturing apparatus according to claim 14, wherein said additional correction adds, as a correction value, a value obtained by dividing by a coefficient M a difference between an exposure dose for forming a desired edge displacement and the exposure dose latitude to a pattern not satisfying the permissible edge displacement depending upon a boundary of the exposure dose latitude in a defocus position for obtaining a desired focal depth, where if the exposure dose required for obtaining a desired position of the edge of the transferred pattern is changed by $\Delta E$ when the edges of an interest to-be-corrected pattern is moved by $\Delta L$, the coefficient M is determined by the following equation:

$$M = \Delta E / \Delta L.$$

16. An exposure mask manufacturing apparatus comprising:

a design data storage section configured to store design data of mask patterns;

an OPC processing section connected to said design data storage section and configured to perform an OPC processing for compensating a critical dimension deviation and a shape deformation occurring between a pattern of an exposure mask and a pattern on a substrate due to optical proximity effects; and a mask writing unit configured to form an exposure mask according to mask writing data obtained by said OPC processing section;

wherein said OPC processing section includes a mask pattern correction unit comprising:

an extraction section configured to extract mask patterns in a range on which the optical proximity effects exert, from the storage section;

a classification section configured to classify said patterns so extracted into to-be-corrected patterns whose edges are actually moved and reference patterns whose edges are not moved; and a correction section configured to correct shapes of said to-be-corrected patterns so that said to-be-corrected patterns are all transferred and finished onto a substrate with each edge being located within a permissible displacement of the edge.

17. An exposure mask manufactured by said exposure mask manufacturing apparatus according to claim 13.

18. An exposure mask manufactured by said exposure mask manufacturing apparatus according to claim 14.

19. An exposure mask manufactured by said exposure mask manufacturing apparatus according to claim 16.

20. A storage medium storing a program that makes a computer correct a design mask pattern to suppress an influence of optical proximity effects that arise when the design mask pattern is transferred onto a substrate, wherein said program comprises:

instruction means for making said computer extract mask patterns in a range on which the optical proximity effects exert;

instruction means for making said computer classify said patterns so extracted into to-be-corrected patterns whose edges are actually moved and reference patterns whose edges are not moved in calculating the correction; and instruction means for making said computer correct shapes of said to-be-corrected patterns so that said to-be-corrected patterns are all transferred and finished within a permissible displacement of the edge.

* * * * *